United States Patent [19]

Langenwalter et al.

[11] Patent Number: 4,683,489
[45] Date of Patent: Jul. 28, 1987

[54] COMMON HOUSING FOR TWO SEMI-CONDUCTOR BODIES

[75] Inventors: Michael Langenwalter, Stockdorf/Gauting; Karl H. Moehrmann, Munich; Herbert Prussas, Reichertshausen; Lothar Spaeter, Annweiler am Trifels, all of Fed. Rep. of Germany

[73] Assignee: Siemens Aktiengesellschaft, Berlin and Munich, Fed. Rep. of Germany

[21] Appl. No.: 762,514

[22] Filed: Aug. 5, 1985

[30] Foreign Application Priority Data

Aug. 8, 1984 [DE] Fed. Rep. of Germany ....... 3429234

[51] Int. Cl.⁴ .................. H01L 23/02; F28F 7/00; H01B 7/34; H02B 1/00
[52] U.S. Cl. ..................... 357/81; 165/80.2; 165/80.3; 174/16 HS; 174/17 R; 361/381; 361/383; 357/74; 357/75
[58] Field of Search ............ 357/74, 75, 81, 22; 174/16 HS, 17 R, 17 LF; 165/80.2, 80.3; 361/381, 383, 384, 386, 388, 389, 390, 393, 394

[56] References Cited

U.S. PATENT DOCUMENTS

| 3,706,010 | 12/1972 | Laermer et al. | 361/382 |
| 3,993,123 | 11/1976 | Chu et al. | 165/80 |
| 4,351,051 | 9/1982 | van Alem et al. | 372/36 |
| 4,394,679 | 7/1983 | Hawrylo | 357/81 |

FOREIGN PATENT DOCUMENTS

| 0020911 | 6/1979 | European Pat. Off. . |
| 0088246 | 9/1983 | European Pat. Off. . |
| 0097782 | 1/1984 | European Pat. Off. . |
| 2460631 | 7/1976 | Fed. Rep. of Germany . |
| 2515341 | 9/1976 | Fed. Rep. of Germany . |
| 312996 | 2/1983 | Fed. Rep. of Germany . |
| 0225659 | 12/1983 | Japan . |
| 1057241 | 12/1955 | Netherlands . |
| 1316086 | 5/1973 | United Kingdom . |
| 1563091 | 3/1980 | United Kingdom . |

OTHER PUBLICATIONS

Hassan et al., "High Performance Chip-Cooling Technique", IBM Technical Disclosure Bulletin, vol. 26, No. 7A, Dec. 1983, pp. 3235-3237.
Metreaud, "Air Cooled Semiconductor Chip Module Configuration", IBM Technical Disclosure Bulletin, vol. 20, No. 7, Dec. 1977, pp. 2697-2698.
Kunkler et al., "Module with Removable Heat Transfer Members", IBM Technical Disclosure Bulletin, vol. 23, No. 9, Feb. 1981, pp. 4095-4096.
Shott, "Boat Thermal Enhancement for Semiconductor Chips and Modules", IBM Technical Bulletin, vol. 26, No. 7, Dec. 1977, pp. 2635-2636.
Archey et al., "IBM Technical Disclosure Bulletin, vol. 22, No. 12 (May 1980), pp. 5288-5290.

Primary Examiner—James W. Davie
Assistant Examiner—Georgia Y. Epps
Attorney, Agent, or Firm—Hill, Van Santen, Steadman & Simpson

[57] ABSTRACT

A common housing for two semi-conductor bodies is provided, comprising a front and back section for two spatially separate semi-conductor bodies attached in the housing interior but preferably connected in electrically conductive fashion to one another, whereby the housing surface preferably composed entirely of metal is cooled during operation by a flowable coolant, preferably cooling air. The front, first semi-conductor body is attached in the front section thereof and the back, second semi-conductor body is attached in the back section thereof, the maximum operating temperature of the back semi-conductor body being higher than the maximum operating temperature of the front semi-conductor body, at least at times. The thermal resistance between the front semi-conductor body and a front thermally conductive cooling surface as well as the thermal resistance between the back semi-conductor body and a back thermally conductive cooling surface differing from the front cooling surface, being respectively lower than both the thermal resistance in the housing interior between the two semi-conductor bodies as well as the thermal resistance between the front and the back cooling surface. During operation, the coolant first flows past the front cooling surface and subsequently flows past the back cooling surface.

7 Claims, 4 Drawing Figures

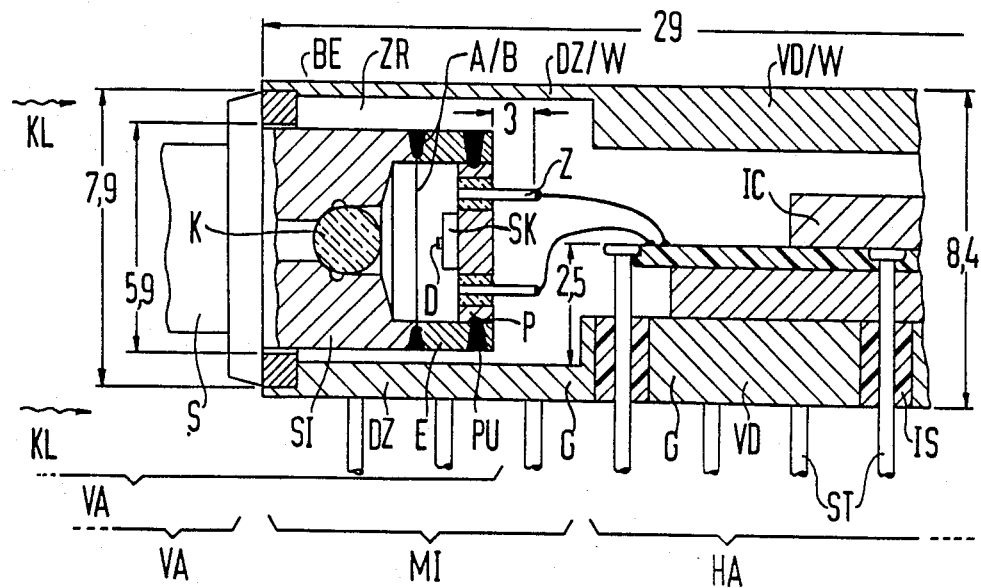
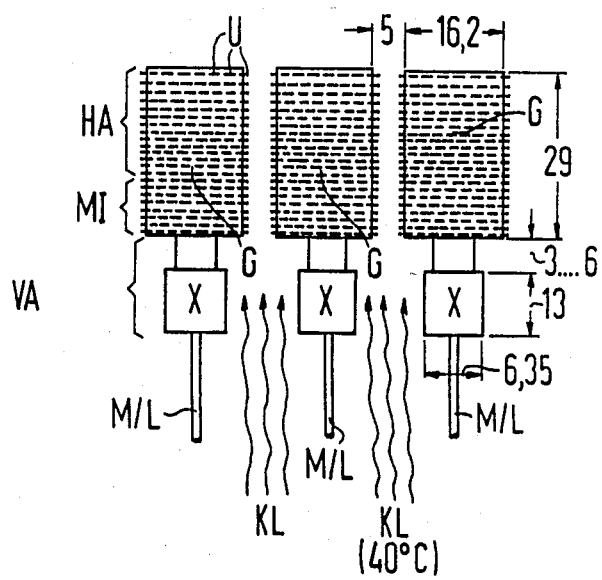

COMMON HOUSING FOR TWO SEMI-CONDUCTOR BODIES

BACKGROUND OF THE INVENTION

Field of the Invention

The invention represents an improvement in a housing for two semi-conductor bodies which are electrically connected and are cooled by a flowable coolant.

SUMMARY OF THE INVENTION

The invention represents a solution or extreme demands made of the cooling of two semi-conductor bodies mounted in a single housing and having different maximally allowable operating temperatures, whereby both semi-conductor bodies are frequently operated close to their maximally allowable operating temperature. Both must thus be well and reliably cooled.

Such an arrangement frequently occurs in optical fiber communication systems, for example comprising optimally small housings arranged in extremely tight spatial juxtaposition, cooled by powerful blowers and having opto-electronic transducers with drivers. Serving, for example, as a transducer is a light-emitable IRED diode as a front, first, cooler semi-conductor body which can at most have a barrier layer temperature of, for example, 80° C. despite its dissipated power of, for example, 200 mW. The back, second, hotter semi-conductor body, i.e. the driver, should reach at most, for example, 125° C. given, for example, 1 W dissipated power. Warm cooling air suppliable at, for example, 40° C. having a flow rate of, for example, 100 m/min is available as a coolant for cooling the housing. The housing, including its optical fiber coupling, should comprise a size of at most, for example, 49 mm × 16.2 mm × 8.4 mm.

The housing becomes too hot without extremely special cooling measures and its semi-conductor bodies are then no longer operational. The object of the invention, to be able to achieve a reliable cooling of both semi-conductor bodies operated close to their mutually different maximally allowable operating temperatures, is achieved by attaching the front semi-conductor body in the front section of the housing and the back semi-conductor body in the back section of the housing, providing a front cooling surface at the front section and a rear cooling surface at the back section, each spaced from one another and from the semi-conductor bodies such that the thermal resistance between the front body and the front surface, as well as the rear body and the rear surface, is less than the thermal resistance between the two bodies and between the two surfaces, and directing the coolant first past the front surface and then past the rear surface.

A plurality of cooling measures prove necessary, namely:

1. The heat from the front semi-conductor body (IRED diode) is to be emitted to the surrounding coolant (cooling air) as completely as possible via the front section of the housing (optical fiber coupling).

2. The heat from the back semi-conductor body (driver) is to be emitted as completely as possible downstream from the front section, i.e. not via the front section in so far as possible.

3. The heat of the front semi-conductor body (IRED diode) is to be distributed to the housing surfaces of the front section washed by the coolant (cooling air).

4. The heat flux from the back section of the housing to the front section of the housing is to be throttled such that the heat of the back semi-conductor body (driver loadable up to 12520 C. with 1 W dissipated power) is not able to heat the front semi-conductor body (IRED diode loadable up to 80° C. having 200 mW dissipated power).

5. As needed, the heat transmission resistance between module and coolant must additionally be able to be made sufficiently small, for example by means of many small ribs, particularly when the allowable operating temperatures of both semi-conductor bodies would otherwise be exceeded given extremely tight integration conditions (narrow air gaps between neighboring housings) and unfavorable, prescribed coolant (cooling air) data.

Other advantageous arrangements provide that the surface layer at the center section of the housing includes at least one thin location or zone for increasing the thermal resistance in comparison to the surface layer at the front and back section. It is preferable to maintain the temperature at the housing surface at the center section between the front and rear section lower than the temperatures of the front and back surfaces.

To achieve the object of the invention, the front semi-conductor body is secured to a thermally conductive, front fastening element which is connected in a highly thermally conductive manner to the front surface, and the back semi-conductor body is secured to a thermally conductive, back fastening element which is connected in a highly thermally conductive manner to the rear surface, so that apart from the wall of the housing and apart from any electrical lines, no thermal bridge of a solid material exists between the front fastening element and the back fastening element. It is desireable to provide the cooling surfaces with irregularities such as peaks, ribs and/or holes to increase the surface areas thereof.

BRIEF DESCRIPTION OF THE DRAWINGS

The invention and the developments thereof shall be explained in greater detail with reference to examples shown in the figures, whereby (all length specifications in mm units):

FIG. 3 shows a greatly magnified longitudinal section through the region between the front section and the back section of an opto-electronic transducer housing for optical fiber communication systems.

FIG. 4 shows a plan view of a plurality of housings of an optical fiber exchange system packed tightly side-by-side under extremely tight integration conditions.

DESCRIPTION OF THE PREFERRED EMBODIMENTS

Description of the Prior Art

Figure 1:
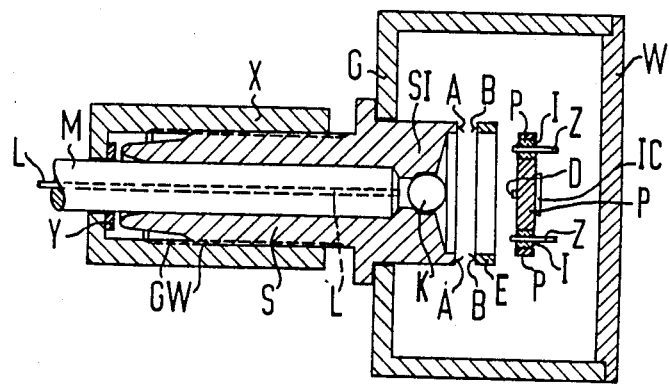
FIG. 1 shows a prior art housing disclosed in copending application Ser. No. 704,332 comprising an opto-electronic transducer for optical fiber communication systems, however, not yet comprising semi-conductor bodies applied in common in the housing in accord with the invention.

FIG. 1 shows details cf an earlier opto-electronic module housing comprising portions G and W disclosed in copending application Ser. No. 704,332 which serves as a light-tight transmission or reception module housing. It contains an optical fiber connection SI, S, namely an optical fiber plug SI, S with a screwed cap fastening nut X for conducting light modulated with information through the housing wall G via the optical fiber M with core L. It also comprises an opto-electronic diode D which is rigidly attached to a plate P adjustable in a first dimension within an adjustment frame E adjustable in two further dimensions. A spherical lens K for optically coupling the optically active location of the diode D to the optical fiber end lies between the optical fiber connection SI, S and the component D.

The earlier module housing G, W shown in section in FIG. 1 contains a tub G as well as a cover W which can be preferably put in place light-tight and gas-tight, the inside of this module housing G, W being thus easily accessible for mountings, adjustments and final checks. Situated at the floor of the tub G, again preferably light-tight and gas-tight, is the optical fiber plug S for the optical fiber plug pin M which can be screwed down by means of the nut X and the stop Y, whereby the diode D, for example a laser diode D lies in the direction of the axis of the optical fiber L.

The plate P shown in a side view in FIG. 1 is actually inserted into the adjustment frame E. At least one part of a surface area B of the adjustment frame E contacts at least one part of a surface area A of the inside part SI of the optical fiber plug S. Since the plate P is displaceable in the direction of the optical fiber axis and since the adjustment frame E is moveable on the area A in two further lateral directions, the diode D secured to the plate P is exactly adjustable as desired in all three dimensions. After this adjustment, the adjustment frame E at the surfaces A and B is rigidly secured, i.e. finally and permanently, to the optical fiber plug S and, thus, to the tub G and, preferably subsequently, the plate P is rigidly secured to the adjustment frame E and, thus, to the tub G. This adjustment as well as these final, rigid fastenings to the tub G preferably ensue under observation or measurement of the optical coupling between optical fiber L and diode D upon corresponding opto-electronic operation of the diode D and of the optical fiber L, whereby the aim is to achieve a maximum, thus optimum optical coupling between the diode D and the optical fiber L by means of the adjustment.

Given a suitably selected refractive index, the spherical lens K can be secured so tightly next to the diode and to the optical fiber that the radiation only penetrates small sections cf the surface of the spherical lens K, despite a potentially broad radiation characteristic lobe of the diode D, but in turn departs the spherical lens K as a thin beam which is largely focused in parallel, whereby even a particularly broad lobe of the diode D can be matched more or less well to a narrow radiation characteristic lobe of the optical fiber end in order to reduce reflections and imaging imprecisions. Given a rigidly adjusted lens K, the tolerance for the spacing between the optical fiber end and the neighboring lens surface can advantageously be made of an almost arbitrarily large size, particularly by means of a suitable selection of other types of lenses instead of the single spherical lens K. The appertaining spacing can then even have extremely larger tolerances.

The diode D is preferably secured in the center of the plate P. The plate P can also be an inexpensive, standardized part P, namely, for example, an ordinary pin base of a regulation telegraph housing comprising a diameter of about 6 mm, whereby the external electrical connections of the diode D including the power supply and grounding can also be conducted through the plate P via the co-standardized bushings Z embedded in insulators I. Moreover, the plate P, the adjustment frame E and the connection S, X can be formed of grounded metal compounds connected to one another in an electrically conductive fashion, whereby an extremely good radio-frequency shielding of the diode D can also be achieved. Due to the thermal conductivity of such metal compounds, the plate P and, thus, the component D are then additionally relatively easily coolable via the surfaces of the housing G, W, particularly when the housing G, W is also composed of metal and comprises well-cooled cooling ribs at its outside.

At least one further semi-conductor body, for example a driver IC, can be mounted to the metallic, grounded plate P on which great crowding frequently prevails, being provided at the back surface thereof which faces away from the surface carrying the diode D. The semi-conductor body IC, is connected in an electrically conductive fashion to the diode D radio-frequencywise via, for example, the bushings Z. Thus, radio-frequency feedbacks between the driver IC and the diode D can be suppressed or attenuated there. Here, however, there is still a relatively tight thermal coupling between the driver IC, the cooled metallic plate P and the diode D. In the meantime, however, it was surprisingly discovered that this thermal coupling is harmful when the extreme operating conditions are present. Further details and modifications cf the earlier module housing shown in FIG. 1 are, moreover, specified in said earlier application.

The Present Invention

Figure 2:
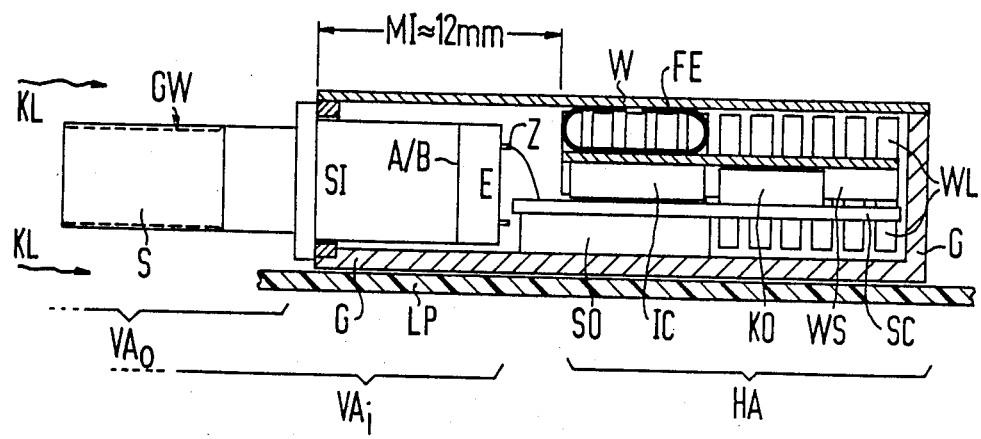
FIG. 2 shows a partially cut side view of a housing embodying the principles of the present invention.

The examples of the housing of the invention shown in FIGS. 2 through 4 are constructed in part similar to the earlier module housing, indicated by the use of identical reference characters. Accordingly, the functions and jobs are correspondingly similar, so that it is essentially only the divergent characteristics of the invention and of the further developments thereof which need be discussed below.

FIGS. 2 through 4 show examples wherein the front, first semi-conductor body D, for example the diode, is mounted in a front section VA and second semi-conductor bodies IC, for example the driver as well as potentially further electronic components such as, for example a capacitor KO in FIG. 2, are mounted in a back section HA. The maximum operating temperature of the back semi-conductor body IC is higher than the maximum operating temperature of the front semi-conductor body D, at least at times. The front section is comprised of an inside portion $VA_i$ and an outside portion $VA_o$.

The thermal resistance between the front semi-conductor body D (which according to FIG. 3, can also be applied on or in a thermally conductive pedestal SK, which may be of a type described, for example, in German Patent Application No. P 34 09 146.7) and a thermally conductive front cooling surface GW, X of the housing surface at the front section VA which is connected to it, as well as the thermal resistance between the back semi-conductor body IC and a thermally conductive back cooling surface of the housing surface at the back section HA connected to it, which differs from the front cooling surface, is in either case, lower than the thermal resistance in the housing interior between the two semi-conductor bodies D, IC as well as the thermal resistance between the front and the back cooling surfaces. The thermal resistance being lower due to a corresponding dimensioning of the housing parts and of the parts in the inside of the housing, for example by means of dimensionings which are known for this purpose.

In the examples of the invention, thus, the thermal resistances are dimensioned in an entirely different fashion than in the earlier module housing, this to be demonstrated with reference to the specific examples shown in the figures.

The thermal resistance in the housing interior between the two semi-conductor bodies D, IC is no longer essentially formed by the relatively thin metallic plate P, cf. FIG. 1, but is now largely formed only via the electrically thin, relatively long connections Z between the two semi-conductor bodies D, IC, shown in FIGS. 2 and 3.

Moreover, it is now only the thermal resistance of the front thermal flux path from the inside of the front section $VA_i$ to the front cooling surface flooded by the coolant KL which is to be made low, i.e., between the front semi-conductor body D and the surface $VA_o$ of the front section SI, S flooded by the coolant KL as already in the earlier module housing according to FIG. 1, but the thermal resistance of a separate thermal flux path in the back section HA from the inside of the back section HA to the back cooling surface thereof flooded by coolant KL, i.e. between the back semi-conductor body IC and the surface of the back section HA flooded by coolant KL is also to be made low in and of itself. In the examples shown in FIG. 2, this low thermal resistance of the back thermal flux path is achieved with the assistance of plates, particularly of resilient plates WL, FE, potentially via solid intermediate parts as well, cf. the pedestal SO, shown only as an example, whereby such intermediate parts or pedestal SO lifting the back semi-conductor body IC can additionally serve the purpose that the lengths of the radio-frequency lines Z become as small as possible, for example for 200 MHz.

For improving the thermal flux from the front semiconductor body D to the front cooling surface, compare FIG. 3 to FIG. 1, the adjustment frame and the part of the front section $VA_i$ adjacent to the parting surfaces A, B to the plug SI can be made particularly thick and these parting surfaces A, B can, for example, be soldered or welded. The plate P can also be made especially thick and soldered into the adjustment frame E or, for example, can be spot-welded to as many points PU as possible along the circumference. Both the plate P as well as the adjustment frame E can be made of materials having particularly good thermal conductivity, for example of steel MUS+42.

Referring to the example shown in FIG. 2, the thickness of the surface layers W, G of the housing are largely uniform. The required, high thermal resistance between the surface of the back section HA and the surface of the front section VA which throttles the heating of the cooler, front semi-conductor body D by the hotter, back semi-conductor body IC is here particularly defined by the great length of the center section MI. This center section MI is only moderately supplied with thermal flux from the inside via its adjoining to the front section VA and to the back section HA, but is externally cooled by the coolant K L. The front semi-conductor body D is heated by the back semi-conductor body IC to a particularly low degree when this thermal resistance of the center section MI as well as its surface cooled by the coolant KL are dimensioned such that, during operation, the temperature at the housing surface in the middle section MI is at least partially lower than the temperatures of the surfaces of both the front as well as of the back section VA, HA.

The housing surfaces, as well the whole housing may be composed entirely of metals. The necessary, relatively high thermal resistance between the front and back surface can also be achieved by selecting a suitable center section material, for example Vacodil, which has only a low thermal conductivity. Particularly thin walls DZ of the housing in the middle section MI, i.e., between the front section VA and the back section HA, as shown in FIG. 3, similarly increase the thermal resistance. As a result thereof, namely, the cross-sectional surface of the housing wall G, W is reduced in the center section MI and, thus, the thermal resistance is increased. An adequately large spacing between housing wall thickenings VD in the back section HA and the material thickenings at P, E, SI in the front section VA act similarly in increasing the thermal resistance. In the example shown in FIG. 3, this spacing like-wise amounts to about 12 mm—as in the example shown in FIG. 2 wherein the housing wall thickenings VD are omitted and, instead, the thermally dissippating, resilient plates WL, FE are attached between the back semiconductor body IC and the housing wall W, G of the back section.

In the examples shown in FIGS. 2 and 3, the two semi-conductor bodies D, IC are secured to their section $VA_i$, HA with special fastening elements having good thermal conductivity which are very special. These fastening elements are a matter of housing wherein, in the inside SI, E, P of the front section $VA_i$, the front semi-conductor body D is secured to a thermally conductive, front fastening element P, E, SI which is connected to the surface layer S, GW, of the front section $VA_o$ in a fashion having good thermal conductivity. Further, in the inside of the back section HA, the back semi-conductor body IC is secured to a thermally conductive back fastening element SC, WL, FE, SO differing from the front fastening element and connected to the back cooling surface in a fashion having good thermal conductivity. Apart from the wall G, W of the housing and apart from the electrical line or, respectively, wires Z, no thermal bridge composed of a solid member is thereby applied directly between the front fastening element P, E, SI and the back fastening element SC, WL, FE, SO. These fastening elements are easy to design or are dimensioned such and are easy to manufacture of such materials that the low thermal resistances between the semi-conductor bodies and allocated surfaces required for the invention are achieved. For example, these fastening elements can be dimensioned as follows:

For thermal reasons, the diode D which is, for example, 0.15 x 0.25 mm$^2$ large should not be glued to its carrier SK or P. Due to the better thermal conduction, it should be soldered on, whereby the layer thickness of the solder should not amount to more than, for example, 10 $\mu$m in order to achieve a good, thermally conductive fastening which, for example, yields an improvement from 67° K./W to 1° K./W.

Instead of being composed, for example, of the composite material copper-bonding layer-Al$_2$O$_3$—ceramic having a thickness of, for example, 1.15 mm, the carrier SC for the driver IC can also be composed of BeO/AlN ceramic having, for example, a thickness of 0.4 mm, which can lead to an improvement of the thermal conductivity of, for example, 8° K./W to 5° K./W. The carrier SC can also carry additional components such as layer resistors and, for example, capacitors KO and lines, for example printed lines, even for radio-frequency, whereby the wires can also be attached between the bushings Z and the lines of the carrier SC, as shown in FIGS. 2 and 3.

The housings generally include current lead pins ST, FIG. 3, preferably disposed in a row with which they can be plugged into the holes of a printed circuit board LP, FIG. 2. these pins ST can, for example, also serve for conducting radio-frequency signals to the driver IC.

When, given the provided flow rate of the coolant and the allowable temperatures, the housing surface is not adequate for cooling, particularly when the housing are integrated tightly packed in operation, for example according to FIG. 4, are plugged, for example, tightly side-by-side into a printed circuit board with their current lead pins ST, the housing surface must be enlarged so that the entire heat can be absorbed by the coolant in the frequently very narrow gaps traversed by coolant and can be carried off. To that end, at least parts of the cooling surfaces can be made irregular by being covered with ribs, naps, burrs, etc., illustrated at U in FIG. 4; if necessary, the cooling surface of the front section, thus, for example, the nuts X, can also be covered in such fashion. A special way of designing such cooling surfaces is disclosed in German Patent application No. P 34 29 269.1, see also U.S. Pat. No. 4,222,090.

As is apparent from the foregoing specification, the invention is susceptible of being embodied with various alterations and modifications which may differ particularly from those that have been described in the preceeding specification and description. It should be understood that I wish to embody within the scope of the patent warranted hereon all such modifications as reasonably and properly come within the scope of my contribution to the art.

We claim as our invention:

1. A common housing for two semi-conductor bodies having a front and back section for two spatially separated semi-conductor bodies attached in the housing interior which are connected electrically conductive to one another, whereby housing surfaces are cooled during operation by a flowable coolant, comprising:
    the front, first semi-conductor body being attached in the front section thereof and the back, second semi-conductor body being attached in the back section thereof;
    the maximum operating temperature of said back semi-conductor body being higher than the maximum operating temperature of the front semi-conductor body;
    the thermal resistance between the front semi-conductor body and a front cooling surface of the housing surface at the front section connected thermally-conductive to it, as well as the thermal resistance between the back semi-conductor body and a back cooling surface of the housing surface at the back section connected thermally-conductive to it, and differing from the front cooling surface, are both lower than both the thermal resistance in the housing interior between the two semi-conductor bodies as well as the thermal resistance between the front and the back cooling surfaces; and
    said front cooling surface being upstream of said back cooling surface in a flow path of said coolant.

2. A housing according to claim 1, wherein a surface layer at a center section of said housing between said front section and said back section comprises at least one thin zone for increasing the thermal resistance in comparison to said front cooling surface and said back cooling surface.

3. A housing according to claim 2, wherein during operation, the temperature at the housing surface in a transition region at a center section between the front and the back cooling surfaces is lower than the temperatures of both the front as well as of the back cooling surface.

4. A housing according to claim 1 wherein, in the inside of said front section, said front semi-conductor body is secured to a thermally conductive, front fastening element which is connected in a thermally conductive fashion to said front cooling surface; and in the inside of the back section, the back semi-conductor body is secured to a thermally conductive, back fastening element differing from the front fastening element and being connected in a thermally conductive fashion to the back cooling surface; such that except for the wall of the housing and the electrical lines, no thermal bridge composed of a solid member is attached directly between the front fastening element and the back fastening element.

5. A housing according to claim 4 wherein,
    the front section contains a light-emitting diode as said front semi-conductor body;
    the front fastening element simultaneously represents an adjustment arrangement for adjusting the position of said diode with respect to an optical fiber connection;
    the front cooling surface contains at least parts of the surface of the optical fiber connection;
    the back section contains a driver chip as said back semi-conductor body; and
    the back cooling surface includes surface irregularities to increase the surface area thereof.

6. A housing for two semi-conductors having front and back surfaces cooled by a flowable coolant comprising:
    a front section in said housing for receiving a first of said two semi-conductors;
    a back section in said housing for receiving a second of said two semi-conductors;
    said front cooling surface being on said front section of said housing;
    said back cooling surface being on said back section of said housing;
        said back cooling surface being separate and distinct from said front cooling surface;
        said semi-conductor having a higher maximum operating temperature than said first semi-conductor;
        said housing having a thermal resistance between said semi-conductors and their associated cooling surface which is less than a thermal resistance in the housing interior between said two semi-conductors as well as being less than a thermal resistance between said front and back cooling surfaces; and
        said front cooling surface being upstream of said back cooling surface in a flow path of said coolant.

7. A housing according to claim 6, including a thermally conductive front fastening element securing said first semi-conductor to said front cooling surface and a thermally conductive back fastening element securing said second semi-conductor to said back cooling surface.

* * * * *